United States Patent [19]

Silva

[11] Patent Number: 5,025,328
[45] Date of Patent: Jun. 18, 1991

[54] CIRCUIT FOR DECODING BINARY INFORMATION

[75] Inventor: Fernando G. Silva, Rochester, N.Y.

[73] Assignee: Eastman Kodak Company, Rochester, N.Y.

[21] Appl. No.: 327,068

[22] Filed: Mar. 22, 1989

[51] Int. Cl.$^5$ .............................................. G11B 5/09
[52] U.S. Cl. ...................................... 360/46; 341/53; 340/825.63; 360/44; 360/51; 375/22; 375/110
[58] Field of Search ............... 341/53, 41; 340/825.63, 340/825.64; 329/106, 107; 360/44, 46, 51; 375/23, 22, 110

[56] References Cited

U.S. PATENT DOCUMENTS

| | | | |
|---|---|---|---|
| 3,720,927 | 3/1973 | Wolf | 366/44 X |
| 4,127,878 | 11/1978 | Johnson | 360/51 X |
| 4,232,388 | 11/1980 | Isailovic | 341/68 X |
| 4,876,697 | 10/1989 | Whitfield | 375/110 X |

FOREIGN PATENT DOCUMENTS 0304799 8/1988 European Pat. Off. .

OTHER PUBLICATIONS

IBM Technical Disclosure Bulletin, vol. 17, No. 3, Aug. 1974, pp. 716-723; J. D. Dennison et al., "Low Cost Network".
IBM Technical Disclosure Bulletin, "Statistical Digital Data Separator", vol. 18, No. 5, Oct. 1975, pp. 1571-1573; T. H. Miller et al.
IBM Technical Disclosure Bulletin, "Non-Synchronous F2F-NRZ Converter & Synchronizer", vol. 23, No. 6, Nov. 1980, pp. 2194-2196, B. C. Dillon.

Primary Examiner—Roy N. Envall, Jr.
Assistant Examiner—Hung Bui
Attorney, Agent, or Firm—Francis H. Boos, Jr.

[57] ABSTRACT

Electrical circuits suitable for decoding binary information, in accordance with a novel modulation method. The novel modulation method is referenced in the instant case, and it is explained that the method may be used when an encoding or decoding information transfer rate may be dependent on unpredictable and variable transfer rate velocities and accelerations. The present electrical circuits provide a novel means to realize the utility of the modulation method.

6 Claims, 3 Drawing Sheets

CIRCUIT FOR DECODING BINARY INFORMATION

CROSS-REFERENCE TO RELATED APPLICATIONS

This application is related to application Ser. No. 206,407 filed Jun. 14, 1988, by Wash, now abandoned; to application Ser. No. 206,408 filed Jun. 14, 1988 by Whitfield et al. now U.S. Pat. No. 4,912,467 issued Mar. 27, 1990; to application Ser. No. 206,553 filed Jun. 14, 1988, by Whitfield now U.S. Pat. No. 4,876,697 issued Oct. 24, 1989; to application Ser. No. 206,646 filed Jun. 14, 1988, by Wash now abandoned; to application Ser. No. 327,073 filed on Mar. 22, 1989, by C. Chi, now U.S. Pat. No. 4,954,825 issued Sept. 4, 1990; and to application Ser. No. 327,071 filed on Mar. 22, 1989 by A. Whitfield, now U.S. Pat. No. 4,951,049 issued Aug. 21, 1990. The entire disclosures of each of these applications are incorporated by reference herein. Each of these applications is copending and commonly assigned.

FIELD OF THE INVENTION

This invention relates to electrical circuits suitable for decoding binary information, in accordance with a novel modulation method.

INTRODUCTION TO THE INVENTION

A novel method for modulating binary data or information into a format suitable for encoding and decoding e.g., magnetic information or optical information, is disclosed in the above-cited U.S. Pat. No. 4,954,825 to C. Chi. The novel method features self-clocking, velocity insensitive encoding and decoding. The Chi disclosure states that preferred electrical circuits that may be employed for realizing the decoding scheme set forth in that disclosure are provided in the present application. This application, therefore, provides novel electrical circuits that may be advantageously employed, for example, for decoding binary data or information that has been encoded in a format in accordance with the Chi disclosure. The novel electrical circuits decode the data, and preserve the self-clocking, velocity insensitive features of the novel method.

SUMMARY OF THE INVENTION

The novel method of Chi is first set forth, in order to provide a perspective for the present invention.

Accordingly, Chi discloses a method for modulating binary data comprising first and second information, the method comprising:

(1) defining an event-cell as the time between two adjacent clock transitions, the clock transitions having a unique characteristic; and (2) selectively writing the information into the event-cell at an arbitrary time, by (i) generating a first event and a corresponding first read signal, in response to the first information; or (ii) generating a second event and a corresponding second read signal, in response to the second information.

With the intent of providing a means for realizing the Chi method, I now disclose an electrical circuit suitable for decoding binary data comprising first and second information; which data has been encoded into an encoded signal, the encoded signal comprising:

(i) a succession of event-cells, each of which event-cells is demarcated by a pair of unique clock transitions; and wherein (ii) each event-cell is dedicated to encoding either a first information or a second information; the electrical circuit comprising:

(1) a reading means for reading the encoded signal and producing a read signal which corresponds to a mathematical derivative of the encoded signal, so that the read signal comprises a succession of event-cells, each of which event-cells comprises a unique pair of clock transition components, and each of which event-cells comprises a first information component or a second information component;

(2) a detector means for interrogating the read signal and producing separate first and second output signals, wherein (i) the first output signal comprises the succession of unique clock transition components, and (ii) the second output signal comprises the first and second information components; and (3) means for mapping, in a one-to-one relationship, the succession of event-cells which are demarcated by a pair of clock transition components, with a first or second information component that has been dedicated in the encoding to that pair of clock transition components.

BRIEF DESCRIPTION OF THE DRAWINGS

The invention is illustrated in the accompanying drawing, in which.

DETAILED DESCRIPTION OF THE INVENTION

I now disclose preferred aspects of the present invention summarized above.

Preferably, the reading means comprises a magnetic head.

Preferably, the detector means comprises a first threshold peak detector, which functions to interrogate the read signal for clock transition components, and to output a first pulse train signal in correspondence to the clock transition components; and a second threshold peak detector, connected in parallel to the first threshold peak detector, which functions to interrogate the read signal for first and second information components, and to output a second pulse train signal in correspondence with the first and second informations.

As summarized above, the novel electrical circuit comprises means for mapping, in a one-to-one relationship, the succession of event-cells which are demarcated by a pair of clock transition components, with a first or second information component that has been dedicated in the encoding process, to that pair of clock transition components. The means for mapping preferably comprises a flip-flop logic circuit comprising (1) a set terminal for inputting the first output pulse train signal; (2) a reset terminal for inputting the second output pulse train signal; and (3) an output terminal for outputting a logic state signal. The logic circuit preferably functions so that (i) in response to the first pulse train signal, the logic circuit outputs a first logic state;

and (ii) in response to the second pulse train signal, the logic circuit outputs a second logic state.

The novel electrical circuit preferably further comprises a delay circuit interposed between the first pulse train signal outputted by the detector means, and the reset terminal of the logic circuit; and means for accessing the first pulse train signal outputted by the detector means, so that it is available as a reference against the logic state signal. The delay circuit is preferred, because it helps avoid any possible ambiguity in the mapping of clock transition components, with the first or second information components. That is, the delay circuit obviates a potential ambiguity that clock transition components could occur simultaneously (hence, ambiguously) with information components.

Figure 1:
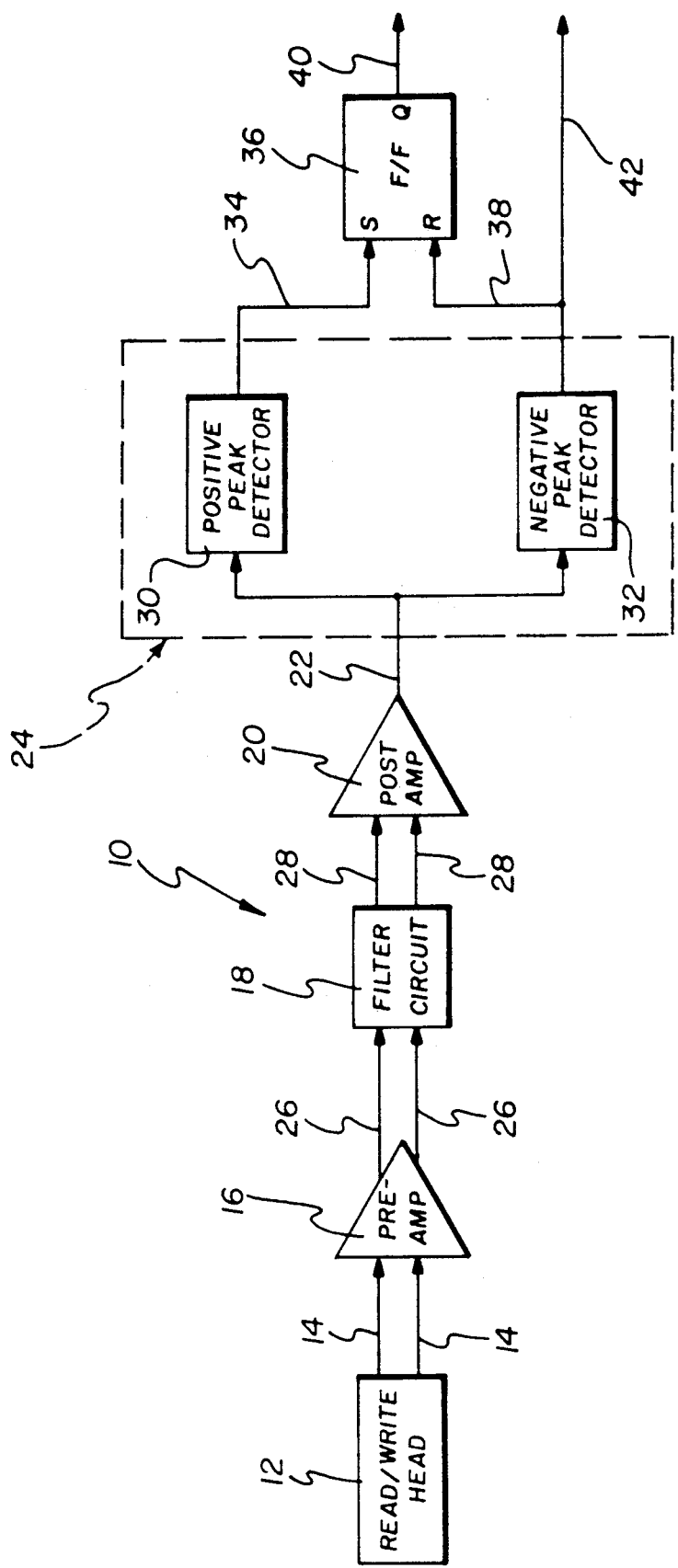
FIG. 1 is a circuit diagram of the present invention.

Attention is now directed to FIG. 1, which shows an electrical circuit 10 of the present invention. The structure of the circuit 10 is first disclosed, followed by its operation.

Accordingly, the circuit 10 comprises a magnetic read/write head 12. The head 12 reads an encoded signal, as explained more fully below, and outputs a read signal along a line pair 14. The read signal is amplified by a pre-amplifier 16, filtered by a filter circuit 18, again amplified by a post-amplifier 20, and inputted along a line 22 to a detector means 24. Appropriate line pairs for processing the read signal are provided by line pairs 26, 28.

The detector means 24, in turn, comprises a positive threshold peak detector 30, and a negative threshold peak detector 32 connected in parallel to the positive threshold peak detector 30. The positive threshold peak detector 30 outputs a first pulse train signal, along a line 34, for input to a set terminal (S) of a latch flip-flop 36; while the negative threshold peak detector 32 outputs a second pulse train signal, along a line 38, for input to a reset terminal (R) of the flip-flop 36. The latch flip-flop 36 further comprises an output terminal Q, from which a logic signal can be outputted along a line 40. The circuit 10 is completed by noting a means 42 for accessing the clock pulse train, for reference against the logic signal on the line 40.

The operation of the FIG. 1 circuit 10 will now be disclosed, and reference additionally will be made to the waveforms shown in FIGS. 2A–D.

An objective of the operation of the circuit 10 is to decode binary data comprising first and second information, which data has been encoded into an encoded signal in accordance with the Chi method, supra.

An example of such an encoded signal, in fact, a partial reproduction of the Chi FIG. 1, is shown in the present FIG. 2A. The encoded signal comprises a succession of two event-cells, each of which event-cells is demarcated by a pair of negative clock transitions. Each event-cell is dedicated to encoding either a first or second information. In the FIG. 2A example, the first event-cell is dedicated to encoding a first information that is a data 0; the second event-cell, on the other hand, is dedicated to encoding a second information that is a data 1. In particular, the data 0 is encoded by way of a first event comprising three alternate information transitions at the locations 4, 5, 6; and the data 1 is encoded by way of a second event comprising a single information transition at the location 5.

The first and second events realize four objectives in the encoding process: (1) they may be located at any arbitrary location within an event-cell; (2) they operate to provide discrimination of the first and second informations; (3) they leave invariant the negative clock transition polarity; and (4) they operate, downstream, to generate first and second read signal components.

Figure 2:
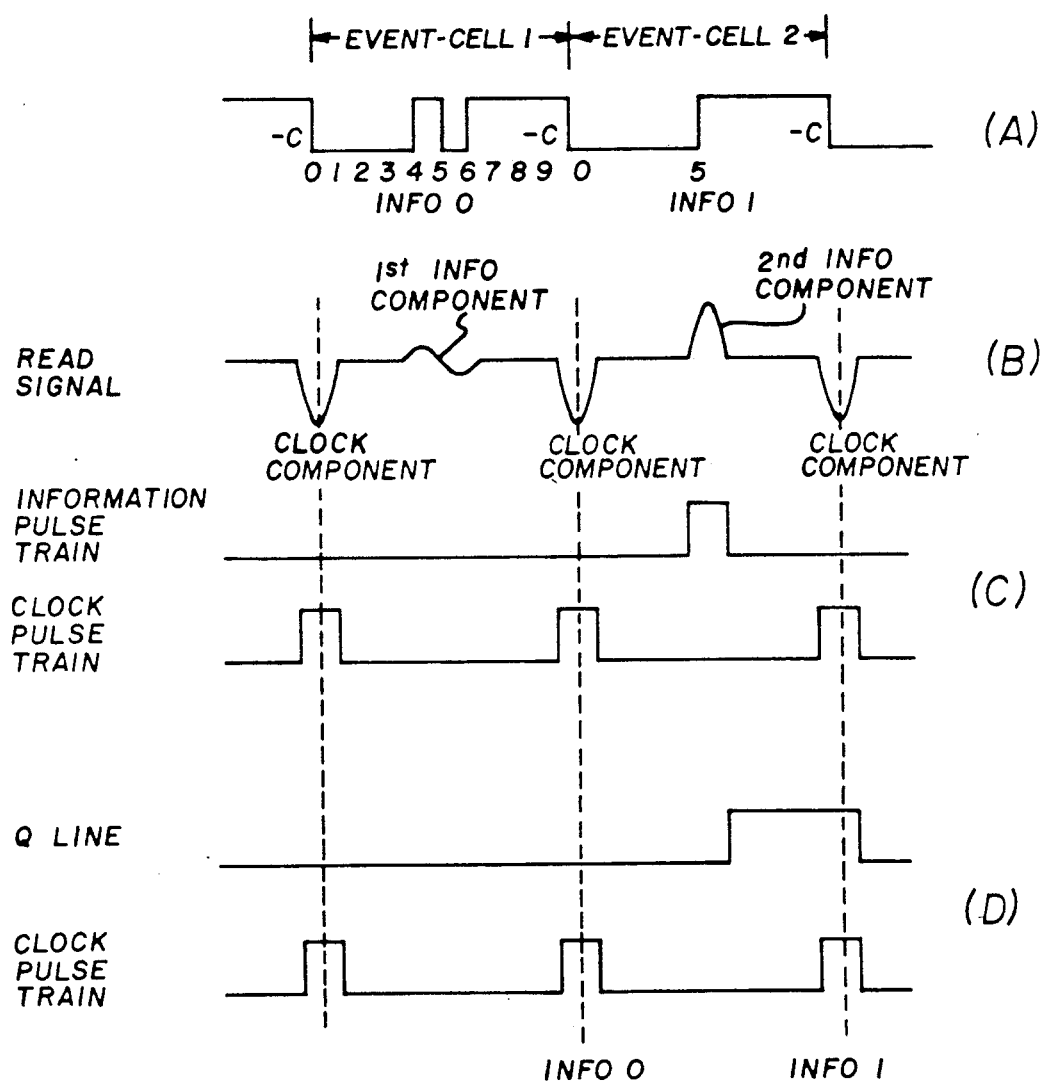
FIGS. 2A-D show waveforms processed by the FIG. 1 circuit.

This last point, on the first and second read signal components, may be restated in the following way. The encoded signal of FIG. 2A is introduced to the FIG. 1 read/write head 12. The head 12 reads the FIG. 2A encoded signal, and produces a read signal (FIG. 2B) which corresponds to a mathematical derivative of the encoded signal. Therefore, the FIG. 2B read signal comprises a succession of two event-cells, each of which event-cells comprises a pair of negative clock transition components. Further, the read signal comprises a first read signal component, corresponding to, and derived from, the information 0=first event; the first read signal component having zero magnitude. Note that the first read signal component has zero magnitude, because the mathematical derivative of the three alternate transitions, comprising the first event, is such as to cancel out, in net, the alternate transitions (see Chi, FIG. 2).

Similarly, the present FIG. 2B read signal comprises a second read signal component, corresponding to, and derived from, the information 1=second event; the second read signal component having a finite magnitude. Note that the second read signal component has a finite magnitude, because the mathematical derivative of the single transition, comprising the second event, is such as to produce a pulse of finite magnitude.

Continuing, the read signal comprising clock transition components, and first and second information components, as exemplified by FIG. 2B, is introduced into the FIG. 1 electronics: the pre-amplifier 16, the filter circuit 18, and the post-amplifier 20, for input along the line 22 to the detector means 24. For pedagogical purposes, it is assumed that the input waveform to the detector means 24, after the electronics, is substantially equivalent to that already shown in FIG. 2B.

The detector means 24, by way of the positive and negative threshold peak detectors 30, 32 respectively, interrogates the FIG. 2B read signal for positive and negative peaks, and produces separate first and second output signals. In particular, the output of the negative threshold peak detector 32, shown in FIG. 2C, is a first output clock pulse train comprising the succession of clock transition components; the output of the positive threshold peak detector 30, on the other hand, is a second output information pulse train (see FIG. 2C) comprising the first and second information components.

Continuing, the first clock pulse train inputs along the line 38 to the reset terminal (R) of the latch flip-flop 36, while the second information pulse train inputs along the line 34 to the set terminal (S) of the flip-flop 36. The flip-flop 36 responds to these inputs in the following manner. Assume that a clock pulse is inputted to the reset terminal. Then, regardless of whether the flip-flop 36 is in a logic 0 or logic 1 state, it outputs a logic 0 at the output terminal Q, along the line 40. This is shown in FIG. 2D. Now assume that an information pulse is inputted to the set terminal. Then, regardless of whether the flip-flop 36 is in a logic 0 or logic 1 state, it outputs a logic 1 at the output terminal Q, along the line 40. Again, see FIG. 2D.

Recall, in our running example, an information 0 has been encoded in the first event-cell, while an information 1 has been encoded in the second event-cell (FIG. 2A). FIG. 2D shows how this information has now been decoded. That is, the first event-cell, defined by the first and second clock pulses on the line 42, when mapped against the output Q line 40, "sees" no pulse. By definition, this means that the information 0 has been encoded in the first event-cell. Similarly, the second event-cell, defined by the second and third clock pulses on the line 42, when mapped against the output Q line 40, "sees" a transition or flip-flop logic 1. By definition, this means that the information 1 has been encoded in the second event-cell.

Figure 3A:
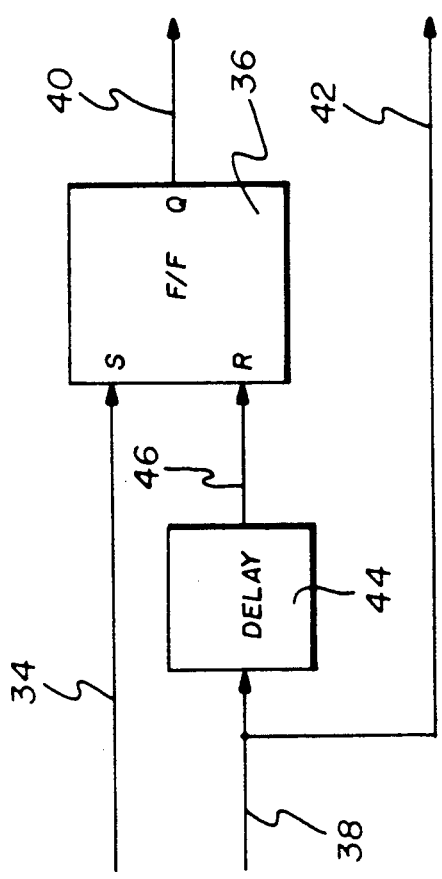
FIGS. 3A, B show alternative embodiments of the present invention.
Figure 3B:
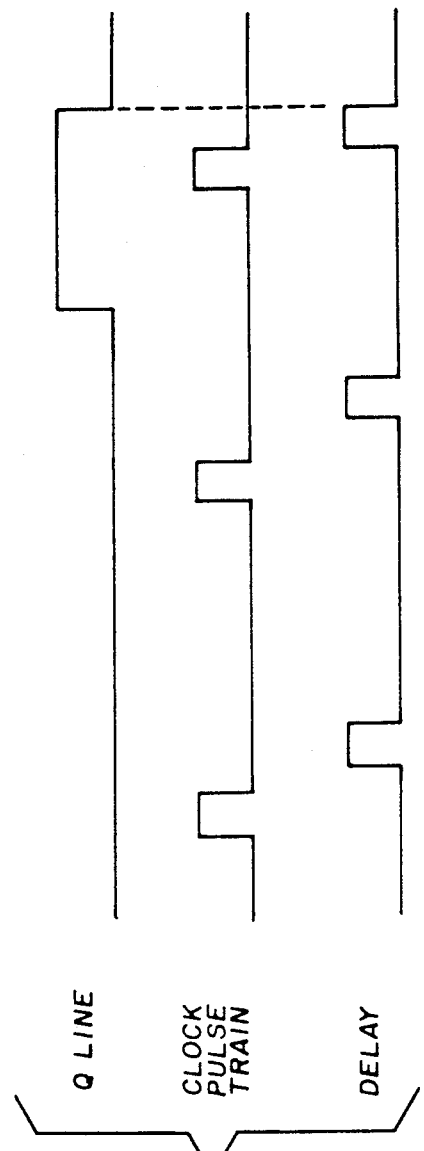

Attention is now directed to FIGS. 3A, B, which show an alternative embodiment of the circuit 10. In particular, FIG. 3A shows a delay circuit 44 interposed between the clock pulse train on the line 38, and the reset terminal (R) of the flip-flop 36, by way of a line 46. The delay circuit 44 can comprise a series of inverters (not shown). Also shown is the means 42 for accessing the clock pulse train outputted by the negative peak detector 32, so that this clock pulse train can be available as a reference against the logic state signal on the line 40. As explained above, the delay circuit 44 obviates a potential ambiguity that clock transition components on FIGS. 2D, could occur simultaneously, hence ambiguously, with information components. FIG. 3B may be compared to FIG. 2D, to show the utility of the delay circuit 44 in avoiding the potential ambiguity.

Finally, it is noted that this invention makes use of e.g., read/write heads, flip-flops, pre-amplifiers, etc. Conventional heads, flip-flops, amplifiers, etc., can be used for this purpose.

What is claimed is:

1. An electrical circuit suitable for decoding binary data comprising first and second information; which data has been encoded into an encoded signal, the encoded signal comprising:
   (i) a succession of event-cells, each of which event-cells is demarcated by a pair of unique clock transitions; and wherein
   (ii) each event-cell is dedicated to encoding either a first information or a second information; the electrical circuit comprising:
      (1) a reading means for reading the encoded signal and producing a read signal which corresponds to a mathematical derivative of the encoded signal, so that the read signal comprises
         a succession of event-cells, each of which event-cells comprises a unique pair of clock transition components, and each of which event-cells contains either a first information component represented by the substantial absence of a read signal in the event-cell or a second information component represented by the presence of a read signal in the event-cell;
      (2) a detector means for interrogating the read signal and producing separate first and second output signals, wherein
         (i) the first output signal comprises the succession of unique clock transition components, and
         (ii) the second output signal comprises the first and second information components; and
      (3) bi-state means responsive to said first and second output signals for assuming during each event-cell either a first state in the absence of a read signal in the event-cell or a second state in the presence of a read signal in the event-cell, thereby mapping, in a one-to-one relationship, the succession of event-cells with the corresponding first or second information component dedicated in the encoding to each event-cell.

2. An electrical circuit according to claim 1, wherein the reading means comprises a magnetic reading head.

3. An electrical circuit according to claim 1, wherein the detector means comprises
   (i) a first threshold peak detector, which functions to interrogate the read signal for clock transition components, and to output a first pulse train signal in correspondence to said clock transition components; and
   (ii) a second threshold peak detector connected in parallel to the first threshold peak detector, which functions to interrogate the read signal for first and second information components, and to output a second pulse train signal in correspondence with said first and second informations.

4. An electrical circuit according to claim 3, wherein the means for mapping comprises a flip-flop logic circuit comprising:
   (1) a reset terminal for inputting said first output pulse train signal;
   (2) a set terminal for inputting said second output pulse train signal; and
   (3) an output terminal for outputting a logic state signal; the logic circuit functioning so that
      (i) in response to the first pulse train signal, the logic circuit outputs a first logic state; and
      (ii) in response to the second pulse train signal, the logic circuit outputs a second logic state.

5. An electrical circuit according to claim 4, further comprising
   (a) a delay circuit interposed between the first pulse train signal outputted by the detector means, and the reset terminal of the logic circuit; and
   (b) means for accessing the first pulse train signal outputted by the detector means so that it is available as a reference against the logic state signal.

6. An electrical circuit according to claim 1 wherein the bi-state means assumes said second state irrespective of the position of the read signal within the event-cell.

* * * * *